United States Patent
Lu et al.

(10) Patent No.: US 7,254,023 B2
(45) Date of Patent: Aug. 7, 2007

(54) HEAT DISSIPATION ASSEMBLY

(75) Inventors: Cui-Jun Lu, Shenzhen (CN); Ling-Bo Cao, Shenzhen (CN); Zhi-Qiang Sun, Shenzhen (CN)

(73) Assignees: Fu Zhun Precision Industry (Shenzhen) Co., Ltd., Bao'an District, Shenzhen, Quangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/265,399

(22) Filed: Nov. 1, 2005

(65) Prior Publication Data

US 2007/0097644 A1 May 3, 2007

(51) Int. Cl.
*H05K 7/20* (2006.01)
*F28F 7/00* (2006.01)

(52) U.S. Cl. .................. 361/698; 361/695; 361/697; 361/700; 165/80.2

(58) Field of Classification Search ............... 361/690, 361/697–700, 703, 710, 695; 165/80.2, 80.3; 257/718, 727
See application file for complete search history.

(56) References Cited

U.S. PATENT DOCUMENTS

| | | | |
|---|---|---|---|
| 6,587,343 B2 | 7/2003 | Novotny et al. | |
| 6,826,047 B1 * | 11/2004 | Chen et al. | 361/687 |
| 6,940,717 B2 * | 9/2005 | Shih-Tsung | 361/695 |
| 6,978,827 B2 * | 12/2005 | Armstrong | 165/80.3 |
| 2004/0057205 A1 | 3/2004 | Chen et al. | |
| 2004/0095722 A1 | 5/2004 | Rong-Yao | |
| 2004/0105233 A1 | 6/2004 | Lai | |
| 2004/0165350 A1 * | 8/2004 | Fan | 361/700 |
| 2004/0231826 A1 * | 11/2004 | Armstrong | 165/80.3 |
| 2005/0061476 A1 * | 3/2005 | Artman et al. | 165/80.3 |
| 2005/0141198 A1 * | 6/2005 | Lee et al. | 361/700 |
| 2006/0012955 A1 * | 1/2006 | Vinson et al. | 361/695 |
| 2006/0032616 A1 * | 2/2006 | Yang | 165/104.33 |
| 2006/0162901 A1 * | 7/2006 | Aizono et al. | 165/80.4 |

* cited by examiner

*Primary Examiner*—Jayprakash Gandhi
*Assistant Examiner*—Anthony Haughton
(74) *Attorney, Agent, or Firm*—Morris Manning & Martin LLP; Tim Tingkang Xia, Esq.

(57) ABSTRACT

A heat dissipation assembly includes a blower holder, a blower, a first heat sink and a second heat sink. The blower includes an inlet and an outlet and is attached to the blower holder. The blower holder is secured to the first heat sink with the inlet of the blower exposed to the first heat sink. The second heat sink is mounted to the blower holder and confronts the outlet of the blower. The second heat sink thermally connects with the first heat sink via heat pipes.

16 Claims, 3 Drawing Sheets

HEAT DISSIPATION ASSEMBLY

BACKGROUND

1. Field

This invention is related to a heat dissipation assembly, and particularly to a heat dissipation assembly having a blower for dissipated heat generated by heat generating electronic devices.

2. Prior Art

It is well known that, during operation of a computer, electronic devices such as central processing units (CPUs) frequently generate large amounts of heat. The heat must be quickly removed from the electronic device to prevent it from becoming unstable or being damaged. Typically, a heat sink is attached to an outer surface of the electronic device to absorb heat from the electronic device. The heat absorbed by the heat sink is then dissipated to ambient air.

Generally, a heat sink mainly comprises a heat conducting base and a plurality of heat dissipating fins extending from one face of the base. In use, the base has a face opposite the fins attached to an electronic device to absorb heat generated by the electronic device; then, the heat reaches the fins to be dissipated to the ambient air.

With the development of computer industry, electronic devices of the computer have more and more powerful capacity. Consequently, more and more heat is produced by the electronic devices. The heat sink aforesaid can not duly remove the heat from the electronic device; as a result, the heat accumulates in the electronic device and the heat sink, which produces adverse impact to the function of the electronic device. For enhancing the heat dissipation efficiency of the heat sink, a fan is typically desired to be combined thereto. Generally, the fan is an axial fan and located atop the fins of the heat sink to provide forced airflow to the fins to accelerate heat convection therein. However, the speedy upgrading trend in computer industry causes electronic devices to become more integration and powerful function, which results in more heat produced in the computer. Furthermore, a height of the computer is required to be smaller and smaller. The conventional axial fan can not meet such trends due to firstly a low air pressure thereof and secondly the mounting of the fan on the heat sink.

In order to overcome aforesaid disadvantages of the conventional heat dissipation device, a blower is used instead of the axial fan. The blower generally produces higher air pressure in comparison with the axial fan. The blower has an inlet for air entering thereto and an outlet for air flowing out of there. Generally, the blower located at a lateral side of the heat sink. The outlet confronts to the heat sink to blow cool air thereto. The air pressure of the blower at the inlet and the outlet of the blower both are high when the blower works. However, in the conventional heat dissipation device having a blower, only the airflow through either the inlet or the outlet of the blower is used to dissipate the heat generated by a heat generating electronic device. The high-pressured airflow produced by the blower is not fully utilized; that is to say, the blower of the heat dissipation device is not fully utilized. Therefore, the conventional heat dissipation device having a blower needs to be improved.

SUMMARY

Accordingly, what is needed is to provide a heat dissipation assembly has a blower and has great heat dissipation capacity.

A heat dissipation assembly in accordance with a preferred embodiment of the present invention comprises a plate-like holder, a blower, a first heat sink and a second heat sink. The holder defines an opening therein. The blower is mounted to a first side of the holder and comprises an inlet fluidly communicating with the opening and an outlet. The first heat sink is mounted to a second side of the holder which is opposite to the first side of the holder. The first heat sink fluidly communicates with the opening so that an airflow generated by the blower flows through the first heat sink into the blower via the opening and the inlet. The second heat sink is mounted on the first side of the holder beside the blower and fluidly communicates with the outlet of the blower so that the airflow leaving the blower via the outlet blows to the second heat sink. A heat pipe is used to thermally connecting the second heat sink and the first heat sink.

Other advantages and novel features of the present invention will be drawn from the following detailed description of preferred embodiments of the present invention with the attached drawings, in which:

DETAILED DESCRIPTION OF THE EMBODIMENT

Figure 1:
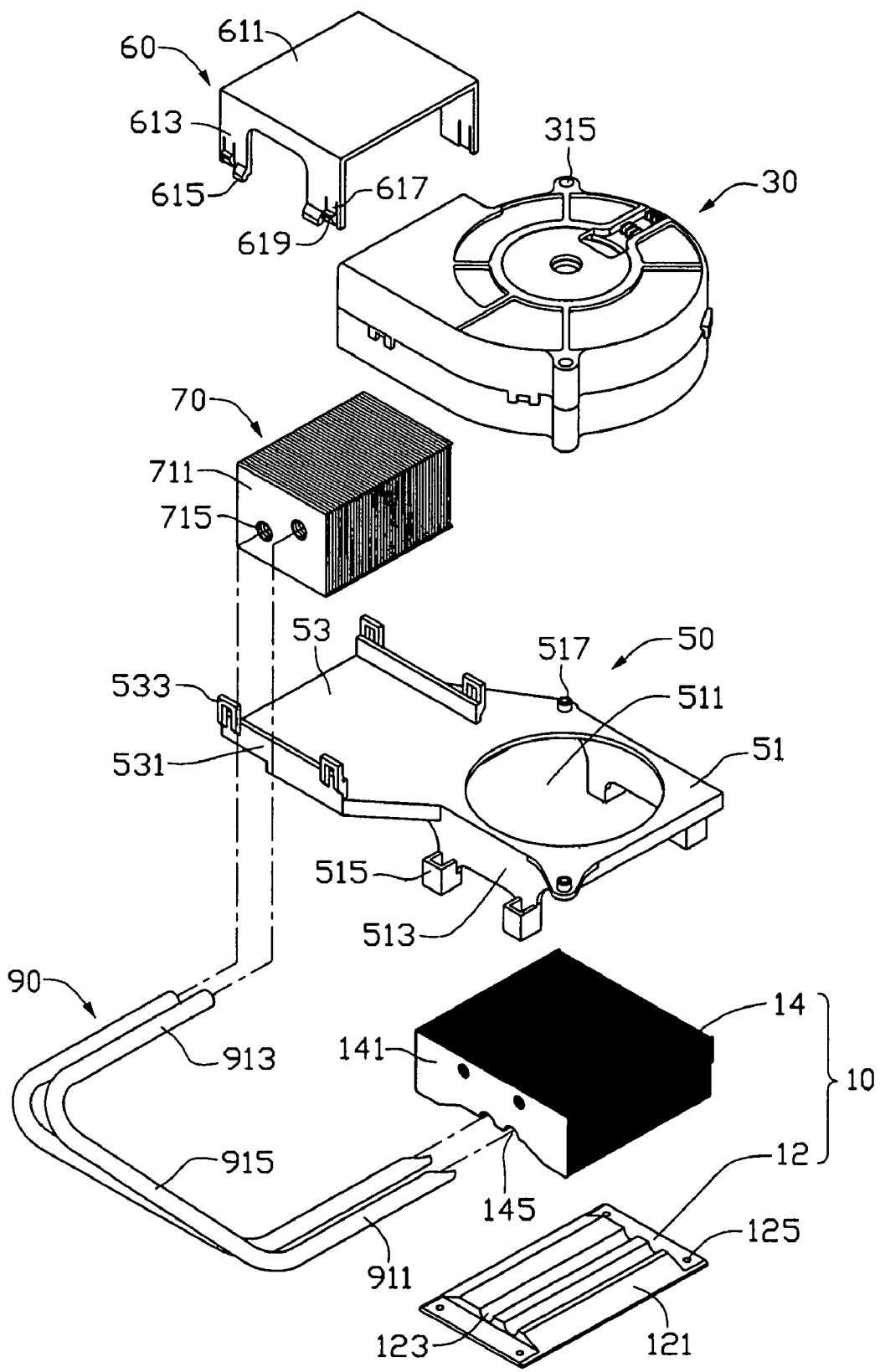
FIG. 1 is an exploded view of a heat dissipation assembly in accordance with a preferred embodiment of the present invention.

Referring to FIG. 1, a heat dissipation assembly comprises a first heat sink 10, a blower 30 for providing forced air to the first heat sink 10, a blower holder 50 for securing the blower 30 to the first heat sink 10, a second heat sink 70, and two heat pipes 90 thermally connecting the first heat sink 10 and the second heat sink 70.

Figure 3:
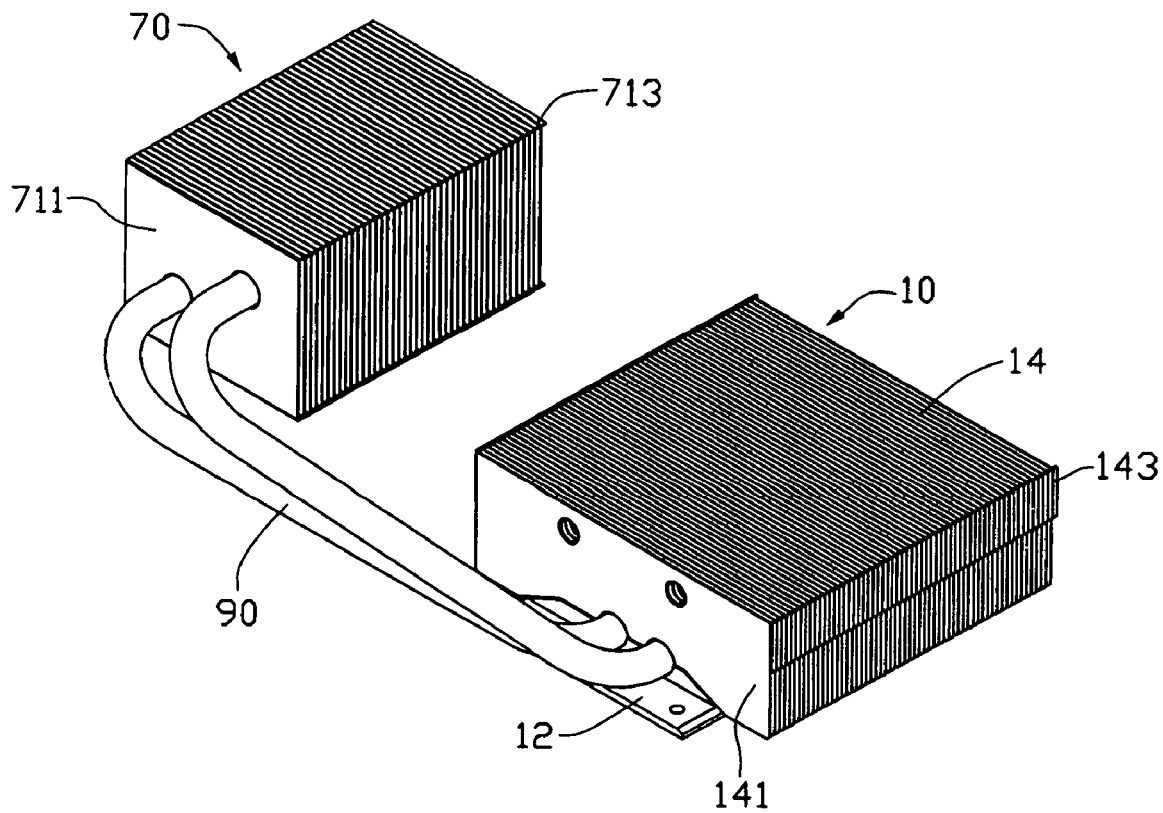
FIG. 3 shows a partially assembled view of FIG. 1.

Referring also to FIG. 3, the first heat sink 10 comprises a base 12 having a bottom face (not labeled) for contacting a CPU (not shown) located on a printed circuit board (not shown), and a fin set 14 arranged on a top face (not labeled) of the base 12. A trapeziform protrusion 121 extends from the top face of the base 12. The protrusion 121 has two opposite slantwise face at two opposite sides thereof. Two parallel grooves 123 each having a semicircular section are defined in the protrusion 121 for receiving the heat pipes 90 therein. Four fixing holes 125 are defined in four corners of the top face of the base 12 for fixing the blower holder 50 to the first heat sink 10.

The fin set 14 has a plurality of fins assembled together and spans on the protrusion 121 of the base 12. Each fin has a body 141 and two flanges 143 perpendicularly extending from two sides the body 141, respectively, and abutting against an adjacent fin. A plurality of passages for airflow flowing therein is defined between the fins. The body 141 has a trapeziform bottom concave (not labeled) matching up to the protrusion 121 of the base 12. The slant faces of the protrusion 121 of the base 12 thermally contact the fins in the concave of the fins. Two parallel grooves 145, each having a semicircular section, corresponding to the grooves 123 of the base 12, are defined in a bottom edge of the body 141 for receiving the heat pipes 90 therein.

Figure 2:
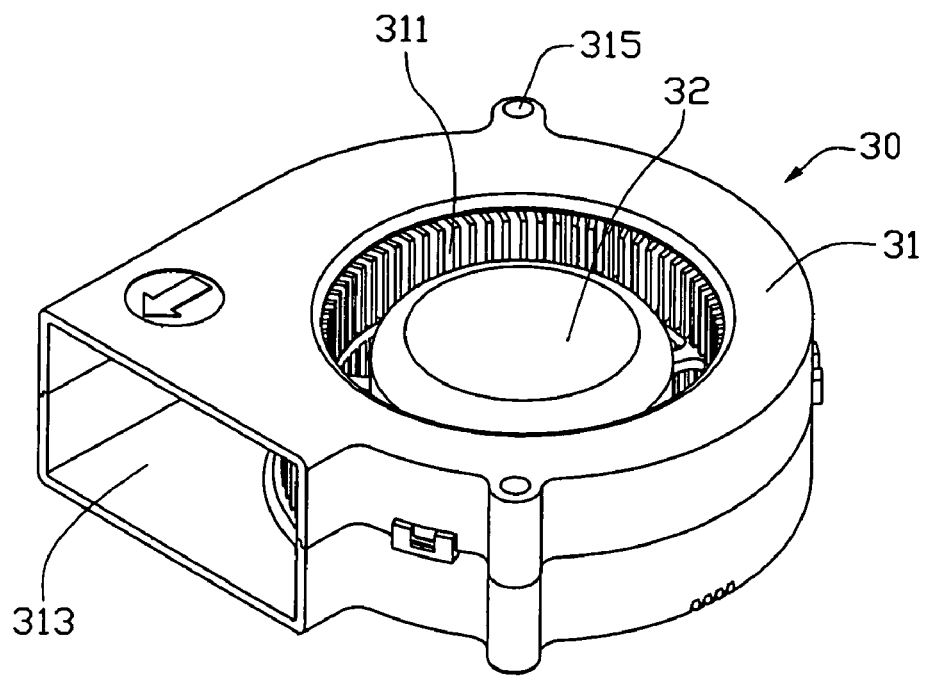
FIG. 2 shows a blower of FIG. 1.

Referring to FIG. 2, the blower 30 comprises shell 31 at a periphery thereof and a blower fan 32 located in the shell 31. The shell 31 has an inlet 311 defined in a bottom thereof for air inflow and an outlet 313 defined in a side thereof for air outflow. Two opposite fixing portions 315 each defining a fixing hole (not labeled) therein are formed at a periphery of the shell 31 of the blower 30.

Referring to FIG. 1 again, the blower holder 50 is plate-shaped, and has a supporting board 51 for supporting the blower 30 and a holding board 53 for holding the second heat sink 70. An opening 511 is defined in a center of the supporting board 53 for airflow passing therethrough. Two positioning boards 513 depend from two opposite sides of the supporting board 51 respectively. Two hollow feet 515 are respectively formed at two ends of each of the two positioning board 513. Two fixing posts 517, corresponding to the fixing portions 315 of the blower 30, diagonally extend upwardly from the supporting board 51 and deviate from the feet 515, for fixing the blower 30 to the supporting board 51. The holding board 53 integrally extends from the supporting board 51. Two fences 531 respectively extend from two opposite edges of the holding board 53. Two retaining ears 533 each having a hole (not labeled) defined therein respectively extend from two opposite ends of each of the two fences 531.

The second heat sink 70 has a plurality of fins assembled together. Each of the fins has a body 711 and two flanges 713 perpendicularly from top and bottom edges of the body 711 respectively. Each flange 713 of each fin abuts against the body 711 of an adjacent fin. A plurality of passages (not labeled) for airflow flowing therein is defined between the fins. A lower and higher through holes 715 are defined in the bodies 711 of the fins of the second heat sink 70.

The heat dissipation assembly further comprises a cover 60 for hooding on the second heat sink 70. The cover 60 has a ceiling 611 and four legs 613 depending from four corners of the ceiling 611. Each leg 613 has a first toe 615 extending outwardly and downwardly from a distal end thereof, and a second toe 617 located beside the first toe 615 and flexibly extending from the leg 513. A barb 619 extends outwardly from the second toe 617 for locking with a corresponding ear 533 of the holding board 53 of the blower holder 50.

Each of the two heat pipes 90 comprises three heat transfer sections: a first section 911, a second section 913 parallel to the first section 911, and a middle section 915 connecting the first section 911 and the second section 913. A round corner is formed at each joint of the three sections of each of the heat pipes 90. The heat pipes 90 have phase change taking place therein when a temperature thereof is raised to a certain degree.

Referring to FIG. 3 again, the first sections 911 of the two heat pipes 90 are received in the grooves 123, 145 to be thermally combined to the base 12 and the fin set 14 of the first heat sink 10. The second sections 913 of the two heat pipes 90 are thermally combined to the through holes 715 of the second heat sink 70.

Figure 4:
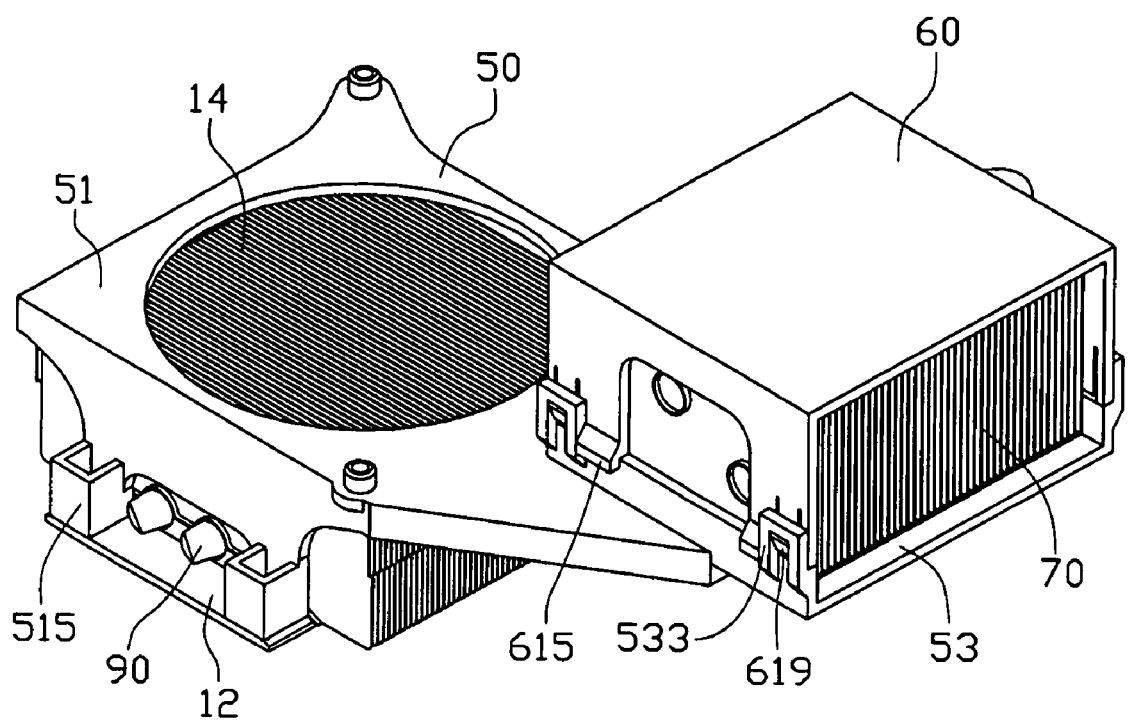
FIG. 4 is a partially assembled view of FIG. 1.
Figure 5:
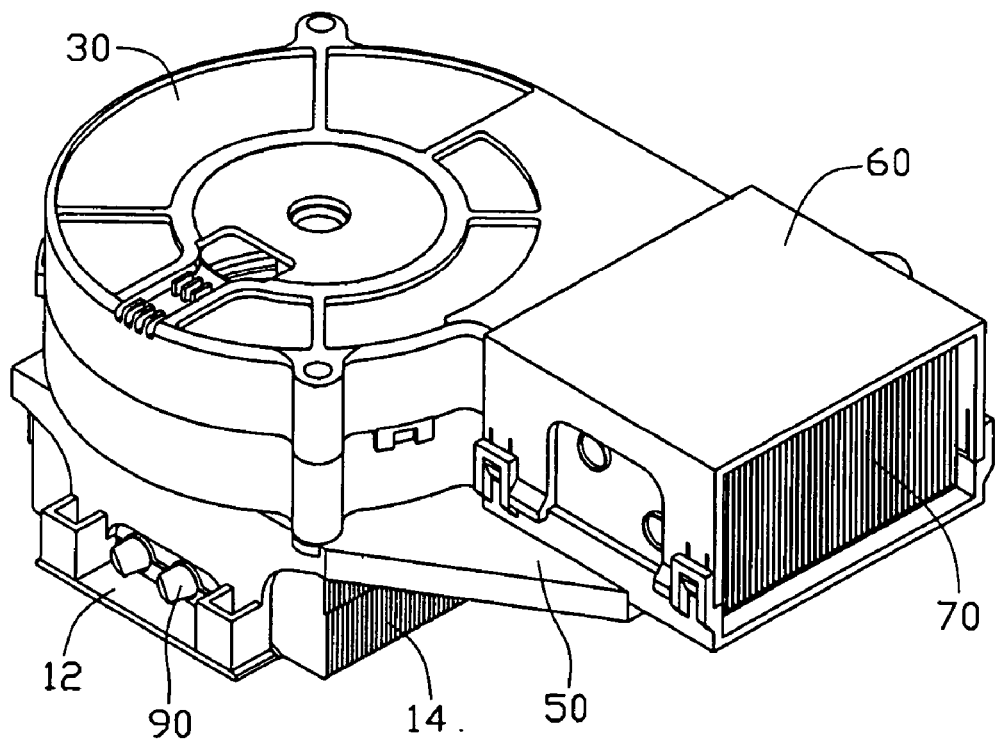
FIG. 5 is an assembled view of FIG. 1.

Referring also to FIGS. 4-5, in assembly, the blower holder 50 spans on the first heat sink 10. The two positioning boards 513 are respectively positioned at two opposite sides of the first heat sink 10. The feet 515 stand on the top face of the base 12 and are fixed to the base 12 via fasteners (not shown) being retained in the supporting feet 515 and the fixing holes 125 of the base 12. Therefore, the blower holder 50 is secured to the first heat sink 10 with the holding board 53 extending away from the first heat sink 10. The second heat sink 70 is arranged on the holding board 53. The second heat sink 70 has two opposite sides thereof blocked between the two fences 531 of the holding board 53 of the blower holder 50. The blower 30 is secured to the supporting board 51 via the fixing posts 517 of the supporting board 51 engaging in the fixing portions 315 of the blower 30. The inlet 311 of the blower 30 corresponds to the opening 511 of the supporting board 51 and is exposed to the first heat sink 10 through the opening 511. The outlet 313 of the blower 30 confronts to the second heat sink 70; preferably, the outlet 313 confronts to the passages between the fins of the second heat sink 70. The cover 60 hoods on the second heat sink 70 and has the four legs 613 thereof engaged with the fences 531 of the holding board 53. The distal ends of the legs 613 abut against top edges of the fences 531 downwardly, the first toes 615 of the legs 613 abut against the top edges of the fence 531 inwards, the barbs 619 of the second toes 617 of the legs 613 engaged in the ears 533 of the fences 531. The heat pipes 90 extend into the cover 60 from an opening (not labeled) between the two legs 613.

In use, the first heat sink 10 has the base 12 thereof attached to the electronic device. The heat generated by the electronic device is absorbed by the base 12, and subsequently transferred to the heat pipes 90 and the fin set 14. The heat transferred to the heat pipes 90 is transferred to the second heat sink 70 very quickly. The heat in the heat pipes 90 is delivered to the fins of the second heat sink 70. The blower 30 draws air into the blower 30 via the inlet 311, thereby producing a high-pressured airflow through the first heat sink 10 under the inlet 311. The high-pressured airflow passes through the fin set 14 of the first heat sink 10 and enters into the inlet 311 of the blower 30, meanwhile, the heat in the fin set 14 is dissipated rapidly. The airflow then leaves the blower 30 through the outlet 311 of the blower 30 and blows to the second heat sink 70, therefore the heat in the fins of the second heat sink 70 is rapidly dissipated to ambient air.

According to the preferred embodiment of the present invention, the first heat sink 10 and the second heat sink 70 respectively confront to the inlet 311 and the outlet 311 of the blower 30. Therefore, the high-pressure airflow produced by the blower 30 passes through the first heat sink 10 and the second heat sink 70 to effectively take heat away from the heat sinks 10,70. Thus, the blower 30 is fully utilized. Therefore, heat dissipation capacity of the heat dissipation assembly of the present invention is improved greatly in comparison with the conventional heat dissipation assembly. Additionally, the second heat sink 70 is thermally connected with the first heat sink 10 by the heat pipes 90, so the heat generated by the electronic device spreads to the first heat sink 10 and the second heat sink 70 to have larger heat dissipation area to be dissipated.

It is to be understood, however, that even though numerous characteristics and advantages of the present invention have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. A heat dissipation assembly comprising:
   a first heat sink;
   a blower attached to the first heat sink, the blower having an inlet and an outlet fluidly communicating with the inlet, the inlet exposed to the first heat sink;
   a second heat sink thermally connecting with the first heat sink and confronting to the outlet of the blower; and a blower holder, wherein the blower holder spans on the first heat sink, the blower being located on the blower holder;

wherein the second heat sink is located on the blower holder beside the blower, wherein the blower holder comprises a supporting board with an opening exposed to the first heat sink, and a holding board beside the supporting board and integrating with the supporting board, the blower being positioned on the supporting board corresponding to the opening, the second heat sink being positioned on the holding board; and wherein two positioning boards depend from the supporting board and two fixing feet are formed at two ends of each of the two positioning boards, the positioning boards being positioned at two opposite sides of the first heat sink, the feet standing on a base of the first heat sink and being fixed to the base.

2. The heat dissipation assembly of claim 1, wherein the second heat sink thermally connects with the first heat sink via a heat pipe connecting the first and second heat sinks.

3. The heat dissipation assembly of claim 1, wherein the supporting board has two diagonal fixing posts deviating from the fixing feet thereof, the blower being attached to the supporting board via the fixing posts engaging with fixing portions defined in the blower.

4. The heat dissipation assembly of claim 1, wherein the blower holder has two fences extending upwardly therefrom and blocking at two opposite sides of the second heat sink.

5. The heat dissipation assembly of claim 4 further comprising a cover, wherein the cover hoods on the second heat sink and engaged with the two fences of the blower holder.

6. The beat dissipation assembly of claim 5, wherein the cover depends four legs each having a flexible barb formed thereon, and wherein each of the two fences of the blower holder extends two ears at two ends thereof, respectively, the barbs being engaged in the ears, respectively.

7. A heat dissipation assembly comprising:
a plate-typed holder defining an opening therein;
a blower mounted to a first side of the holder, the blower comprising an inlet fluidly communicating with the opening and an outlet, the inlet facing toward a first direction, the outlet facing toward a second direction which is perpendicular to the first direction;
a first heat sink mounted to a second side of the holder which is opposite to the first side of the holder and fluidly communicating with the opening;
a second heat sink mounted to said first side of the holder, located beside the blower and fluidly communicating with the outlet of the blower; and
a heat pipe thermally connecting the first and second heat sinks;
wherein the holder has two fences extending upwardly therefrom and blocking two opposite sides if the second heat sink.

8. The heat dissipation assembly of claim 7, wherein the first heat sink comprises a base and a plurality fins, and wherein the holder has a portion located on the fins and a portion fixed to the base.

9. The heat dissipation assembly of claim 8, wherein the base of the first heat sink has a protrusion embedded in the fins and thermally contacting the fins of the first heat sink.

10. The heat dissipation assembly of claim 9, wherein the protrusion of the base of the first heat sink defines a groove therein, and wherein the fins corporately define a groove corresponding to the groove of the base, the heat pipe having a portion thermally combined to the grooves of the base and the fins.

11. The heat dissipation assembly of claim 7, wherein the outlet of the blower confronts a plurality of fins of the second heat sink.

12. The heat dissipation assembly of claim 11, wherein the fins of the second heat sink corporately define a through hole therein, the heat pipe having a portion thermally combined to the through hole.

13. The heat dissipation assembly of claim 7 further comprising a cover, wherein the cover hoods on the second heat sink and engages with the two fences of the holder.

14. A heat dissipation assembly comprising:
a blower having an inlet and an outlet, wherein the inlet and the outlet are oriented perpendicular to each other;
a first heat sink having a bottom face adapted for contacting with a heat-generating electronic device;
a second heat sink;
a heat pipe thermally connecting 33the first heat and the second heat sink; and
a plate-like blower holder integrally forming a supporting board defining an opening and a holding board, the first heat sink being mounted under the supporting board and the blower being mounted on the supporting board with the inlet communicating with the first heat sink via the opening, the second heat sink being mounted on the holding board and located beside the blower;
wherein an airflow generated by the blower running through the first heat sink into the blower via the inlet, and then leaving the blower via the outlet and blowing to the second heat sink;
wherein the holding board has two fences extending upwardly therefrom and blocking two opposite sides of the second heat sink.

15. The heat dissipation assembly of claim 14, wherein the first heat sink has a base and a fin set mounted on the base, the base having a trapeziform protrusion engaging in a trapeziform bottom concave of the fin set.

16. The heat dissipation assembly of claim 14 further comprising a cover, wherein the cover hoods on the second heat sink and engages with the two fences of the holder.

* * * * *